Figure 1:
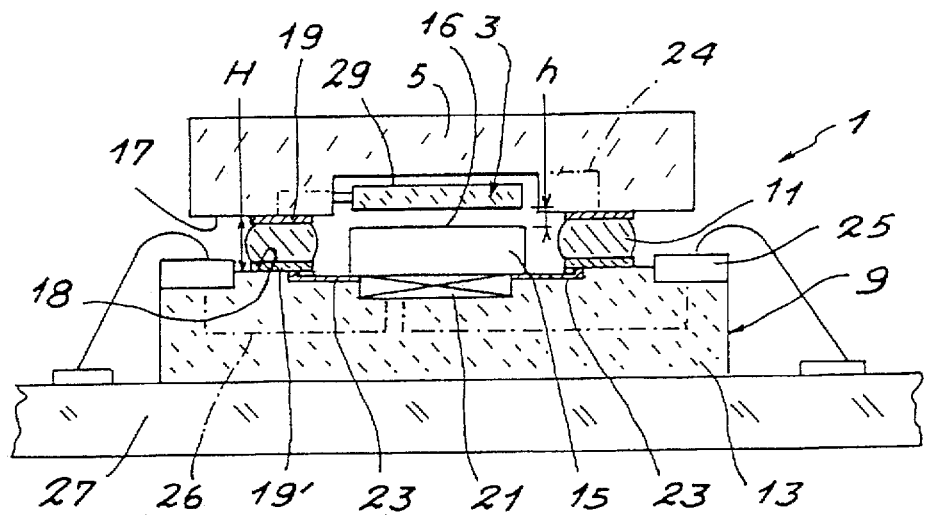

United States Patent [19]

Caillat

[11] Patent Number: 5,734,106
[45] Date of Patent: Mar. 31, 1998

[54] INTEGRATED ELECTRONIC SENSOR FOR CHARACTERIZING PHYSICAL QUANTITIES AND PROCESS FOR PRODUCING SUCH A SENSOR

[75] Inventor: Patrice Caillat, Echirolles, France

[73] Assignee: Commissariat a l 'Energie Atomique, Paris, France

[21] Appl. No.: 605,044

[22] PCT Filed: Sep. 29, 1994

[86] PCT No.: PCT/FR94/01141

§ 371 Date: Mar. 1, 1996

§ 102(e) Date: Mar. 1, 1996

[87] PCT Pub. No.: WO95/09367

PCT Pub. Date: Apr. 6, 1995

[30] Foreign Application Priority Data

Sep. 30, 1993 [FR] France ................... 93 11672

[51] Int. Cl.$^6$ ............... G01P 15/00; G01L 9/00; H01G 7/00
[52] U.S. Cl. ................ 73/514.01; 73/514.32; 73/754; 361/280
[58] Field of Search .............. 73/514.32, 514.16, 73/514.01, 514.36, 514.21, 726, 724, 720, 718, 716, 754, DIG. 4; 361/280, 283.1, 283.4; 29/621.1, 854, 825; 228/123.1, 254; 437/228, 209, 203, 185

[56] References Cited

U.S. PATENT DOCUMENTS

| 4,930,043 | 5/1990 | Wiegand | 361/283 |
| 5,164,328 | 11/1992 | Dunn et al. | 437/54 |
| 5,355,283 | 10/1994 | Marrs et al. | 361/760 |

OTHER PUBLICATIONS

Quinnell, "Silicon Accelerometers Tackle Cost–Sensitive Applications," *End–Technology Update (EDN Electrical Design News)*—vol. 37(18), pp. 69–76 (1992).

Rahali, et al., "Low–Cost Integrated Silicon Sensors for Industrial Applications," *9th European Hybrid Microelectronics Conference* (Session 2B)—pp. 242–249.

Primary Examiner—Hezron E. Williams
Assistant Examiner—Richard A. Moller
Attorney, Agent, or Firm—Burns, Doane, Swecker & Mathis LLP

[57] ABSTRACT

The integrated electronic sensor for characterizing physical quantities comprises a substrate (5) having a characterizing member (3) and a cover (9) maintained in the vicinity of and in front of the characterizing member (3) by means of at least one ball (11) bearing on the substrate (5), so as to provide a first spacing between the cover (9) and the substrate and is characterized in that the cover has a boss (15) facing the characterizing member (3) so as to define a second spacing between the cover (9) and the member, which is smaller than the spacing between the cover and the substrate.

26 Claims, 2 Drawing Sheets a b c d e f

1

INTEGRATED ELECTRONIC SENSOR FOR CHARACTERIZING PHYSICAL QUANTITIES AND PROCESS FOR PRODUCING SUCH A SENSOR

DESCRIPTION

The present invention relates to an integrated electronic sensor for characterizing a physical quantity incorporating a characterizing member, whereof one part is mobile.

The invention more particularly applies to the field of microelectronics, where the development of micromachining methods permits the production of characterizing members able to transform quantities such as acceleration, pressure or flow into characterizable electrical effects by the measurement or acquisition of signals on a hit and miss basis.

Sensors of this type have a characterizing member mobile relative to a substrate which, on deforming or moving, creates either an electrical potential, or gives rise to the modification of the value of a capacitor, inductance or resistor. The modification of these characteristics is exploited by an electronic reading circuit associated with the component. An illustration of the technologies involved in sensors is given by the article "Low-cost integrated silicon sensor" by Fouad Rahali et al., 9th European Hybrid Microelectronics Conference, pp 243 to 249.

These sensors also have a cover, which has a number of functions. It must protect the characterizing member against environmental stresses and must permit its maintenance, particularly in the case of physical stresses exceeding the mechanical limits of the member.

In an accelerometer incorporating a seismic mass able to move under the effect of an acceleration, the cover serves as an abutment for preventing an exaggerated displacement of the mass, which may give rise to the deterioration thereof.

Generally, a spacing is provided between the cover and the sensitive characterizing member so as to prevent, in normal operation, contact between said two parts. Thus, the cover does not impede the movement of the characterizing member and leads to no deterioration of the result of the measurements. Such an arrangement is described in U.S. Pat. No. 5,164,328, where the cover is also formed by an integrated circuit substrate. It is known from the latter document to assemble the cover and the substrate having the characterizing member by means of an interconnection procedure using meltable material balls and generally known as flip chip.

This procedure consists of depositing on one of the parts to be assembled, meltable material assembly rolls or balls and to raise the two parts to be assembled, which face one another, to a temperature slightly above the melting point of the material of the balls, so as to bring about a type of brazing.

Preferably, on the parts to be assembled are previously formed interconnection elements constituting a wetting surface with respect to the balls or rolls. The elements respectively of each part to be assembled are positioned facing one another and the balls are only deposited on the elements of one of the parts.

The assembly of the cover and the substrate incorporating the characterizing member by the flip chip procedure is very interesting, because the interconnection balls ensuring the cohesion of the structure also permit an electric contact when they are conductive. Another essential function of the balls is to maintain and define the spacing between the cover and the characterizing member.

Unfortunately, this solution is difficult to apply in numerous sensors.

Thus, due to a miniaturization of the sensors linked with the emergence of new machining technologies on the surface (such as etching), the spacing between the cover and the sensitive characterizing member must be very small and in particular obtained with very high precision. For example, in the case of an accelerometer, there is a spacing of 2 to 5 µm between the cover and the seismic mass.

However, with existing flip chip interconnection procedures, it is very difficult to attain spacings below 15 µm with a sufficient accuracy.

Moreover, when the interconnection balls are of small size for reducing the spacing between the cover and the characterizing member, thermomechanical behavioural problems occur.

As the expansion coefficients of the interconnected parts can differ widely, significant stresses may appear in the balls under the effect of a temperature variation.

In the same way, when the substrate and cover are of the same nature and with the cover generally incorporating a reading circuit, the latter heats in operation and consequently expansion differences exist between the cover and the substrate.

The solution to this problem consisting of increasing the size of the balls would, in the present case, run counter to the sought aim of reducing the spacing between the characterizing member and the cover.

Therefore the invention relates to an electronic sensor and to its production process permitting a solution to the aforementioned problems.

An object of the invention is to provide a sensor, in which the distance between the cover and the characterizing member is both very small and controllable with a very high degree of precision.

Another object of the invention is to provide an interconnection between the cover and the characterizing member, which has a good resistance to thermomechanical stresses and which can be very easily implemented.

Therefore the invention relates to an integrated electronic sensor for characterizing a physical quantity, incorporating a substrate having a characterizing member, whereof part is able to deform in at least one direction, and a cover maintained in the vicinity of and in front of the characterizing member by means of at least one meltable material ball integral with the substrate and having a height adapted to the thermomechanical stresses of the sensor, so that a first spacing is provided between the cover and the substrate, characterized in that the cover has a boss with a controlled thickness facing the characterizing member, so as to define a second spacing between the cover and the member which is smaller than the spacing between the cover and the substrate.

This boss, whose thickness can be controlled in a simple and precise manner, makes it possible to very accurately adjust the free distance of the cover up to the characterizing member.

The boss also serves to prevent an excessive displacement or deformation of the characterizing member or the mobile part thereof. To this end, the boss has an abutment surface against which the characterizing member bears when subject to an excessive stress.

In general terms, the second spacing between the cover and the characterizing member is at the maximum equal to the travel authorized prior to the breaking of the characterizing member.

The boss can also protect the mobile part of the characterizing member by preventing it from performing a displacement in a direction not corresponding to the intended displacement direction. For this purpose, the surface of the boss facing the characterizing member is advantageously oriented parallel to the displacement direction of the mobile part of the characterizing member.

At a minimum, the size of the boss will be that of the mobile part which it faces. It could optionally be machined in order to comply with certain geometrical criteria of said mobile part. In particular, the boss can be etched in accordance with the same geometry as the mobile part (e.g. in comb form). It could be made from an insulating or conducting material if it was wished to use it as a second electrode of an electrical circuit, the mobile part then forming the first electrode.

In the case of hit or miss characterizations, the boss is made from an electrically conductive material. The boss may only have one electrically conductive material part, which then forms the abutment surface. The conductive material can e.g. be aluminium.

This particular case where the boss is conductive may also make it possible to obtain a sensor sensitive in three directions, namely the directions x and y parallel to the surface of the sensor substrate like the conventional sensors described hereinbefore and direction z perpendicular to the sensor substrate surface, by electrical contact between the mobile part and the boss or by modifying the capacitance between these two conductors. Such a sensor can in particular be used in the characterization of an acceleration in space and therefore in the production of a three-dimensional accelerometer.

The cover may simply be stuck to the balls, which maintain it at a distance from the member. However, advantageously, the cover and the member are connected to an interconnection process using meltable material balls using the flip chip procedure. These balls can also be meltable material rolls.

As a result of the invention, the interconnection balls can be in accordance with standard knowledge. Effectively, in the sensor according to the invention, the balls ensure the mechanical maintenance of the cover and possibly the electrical contact, but do not serve to define the second spacing between the cover and the characterizing member. This spacing is defined by the thickness of the boss of the cover, which is positioned facing the characterizing member.

However, the balls do make it possible to define the first spacing between the cover and the substrate.

Moreover, if the boss is sufficiently thick, the balls can be of large size and consequently obviate the problem linked with mechanical stresses associated with a possible difference between the expansion coefficients. Larger balls also permit easier production.

According to another interesting feature of the invention, the cover is formed by a substrate having an electronic reading circuit.

The cover and the substrate are provided with interconnection elements to which the characterizing member and the electronic reading circuit are respectively connected. These elements are used for the deposition of balls for interconnection purposes and with said balls ensure the electrical connection between the characterizing member and the electronic circuit.

The invention also relates to a process for producing a sensor.

Other features and advantages of the invention can be gathered from the following illustrative and non-limitative description with reference to the drawings, wherein show:

FIG. 1 A diagrammatic sectional view of a sensor according to the invention.

Figure 2A:
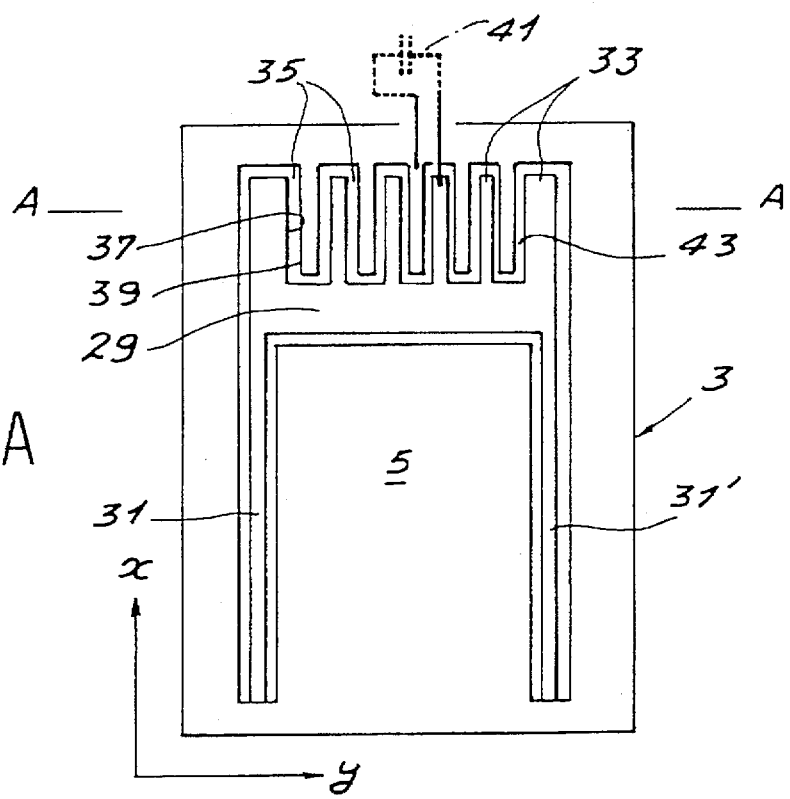
Figure 2B:
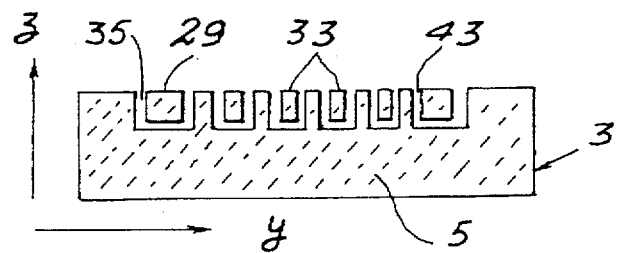

FIGS. 2A & 2B Diagrammatic plan and sectional views along line A—A of the etched substrate incorporating the seismic mass of the sensor according to the invention.

Figure 3:
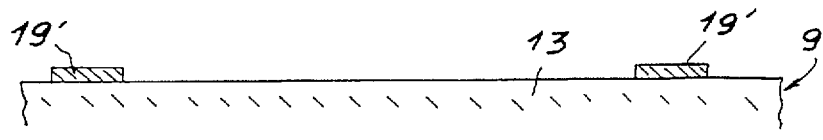
Figure 3:
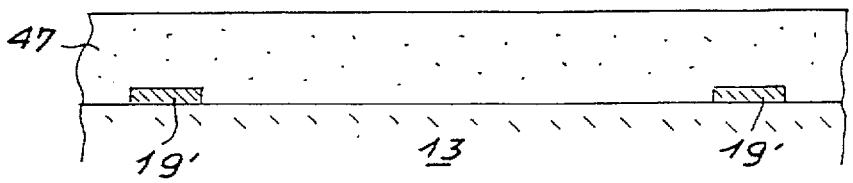
Figure 3:
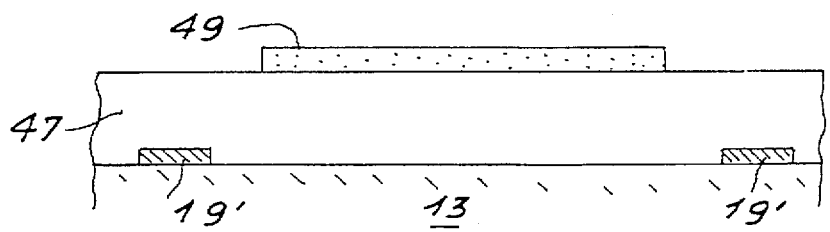
Figure 3:
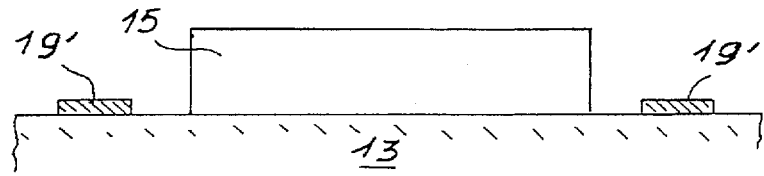
Figure 3:
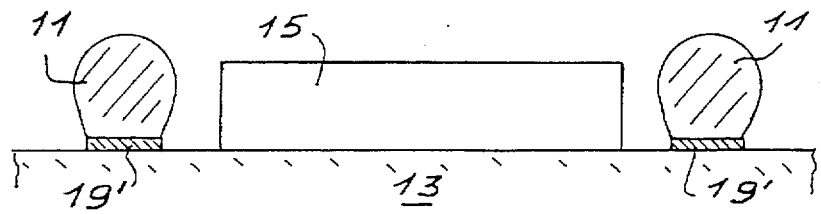
Figure 3:
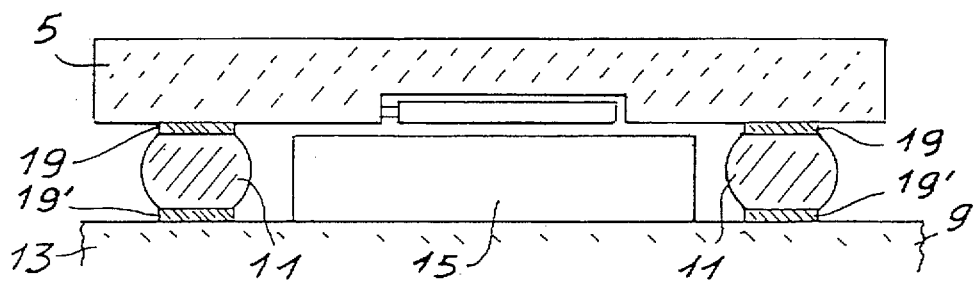

FIG. 3 A sectional view of different stages of the production of a sensor according to the invention.

As can be seen in FIG. 1, the sensor 1 has a substrate 5 with a characterizing member 3 obtained by micromachining. The substrate 5 is connected to the cover 9 by means of interconnection balls 11 located on either side of the characterizing member 3. These balls maintain the cover 9 at a distance H from the substrate 5.

The cover 9 is formed by a substrate 13, preferably of an insulating or semi-insulating material and a boss 15 formed on the substrate 13 in the region facing the characterizing member 3. This boss 15 makes it possible to reduce and accurately define compared with the prior art the spacing h between the cover 9 and the characterizing member 3. This spacing h is much smaller than the spacing H between the substrate 5 of the characterizing member and the substrate 13 of the cover 9, i.e. in the region surrounding the boss 15.

On their facing surfaces 18 and 17, in the region surrounding the boss 15 and the characterizing member 3, the cover 9 and the substrate 5 of the member 3 are provided with interconnection elements 19, 19', which permit the attachment of the balls 11 and a good electrical contact for the same. These balls are used for connecting the characterizing member 3 to an electronic circuit 21 produced in the substrate 13 of the cover 9, e.g. beneath the boss 15.

In order to avoid the aforementioned thermomechanical stress problems, the spacing H (height of the balls) is made adequate compared with the size of the chip (substrate). Typically, a choice is made of $H > 10^{-2} \times D$, in which D is the size or the largest dimension of the chip (substrate). For example $H \geq 45$ µm for a substrate 5 of 4×4 mm. In this case, definition takes place of the boss 15 with a thickness of 40 µm so as to have a spacing h between the cover and the characterizing member of 5 µm.

Current leads 23 and 24 respectively formed on the substrate 13 and the substrate 5 connect the characterizing member 3 and the electronic circuit 21 to the balls 11, via the elements 19, 19'. In this example, the leads 24 are integrated into the substrate 5.

The electronic circuit 21 is connected, via tracks 26 integrated into the substrate 13, to external contact elements 25 formed on the cover surface 18. These elements 25 are themselves connected e.g. to tracks of a printed circuit 27 on which the sensor is mounted via the cover.

In the case of an accelerometer, the characterizing member 3 can incorporate, as shown in FIGS. 2A and 2B, a seismic mass 29, which is parallelepipedic in the plane (x,y) of the substrate surface and which is the plane of FIG. 2A.

The seismic mass 29 is connected to the substrate 5 by two flexible beams 31, 31' and is provided, in the direction opposite to that of the beams, with teeth 33 extending freely into grooves 35 made in the substrate. The mass 29 is displaceable in the direction y parallel to the substrate plane x, y.

Lateral portions 37, 39, in direction x, of the teeth 33 of the seismic mass 29 and grooves 35, are respectively covered with a metallic coating and/or are themselves of a conductive nature, e.g. of doped silicon, forming the plates of a variable capacitance capacitor 41. Under the effect of an acceleration, the seismic mass 29 is displaced and the thickness of an air layer 43 located in the interstices between the parts 37, 39 is modified. This air layer 43 constituting the dielectric of the capacitor means that the value of the capacitance measured on the plates is also modified.

FIG. 2B illustrates the movement of the seismic mass in direction y, level with the teeth 33.

It is necessary to ensure that an acceleration in direction z perpendicular to the substrate surface, i.e. to the plane x,y, does not give rise to a movement of the seismic mass of greater amplitude than the depth of the grooves in which the teeth are located in order not to dislodge the latter.

It must also protect the seismic mass against an excessive movement exceeding the yield strength of the beams 31, 31'. Thus, a stop must be provided at a distance of the same order of magnitude as the depth of the grooves 35, i.e. 5 to 20 μm.

According to the invention, the movement along axis z is limited by the boss 15 provided with an abutment surface 16. For this purpose the boss 15 must be at a spacing h from the surface of the substrate 5 of preferably 0.5 to 5 μm.

FIG. 3 illustrates in section a process for producing the sensor according to the invention.

Firstly one or preferably several interconnection elements 19' and 19 are produced, respectively on the substrate 13 of the cover 9 and on the substrate 5 of the member 3 (parts a and f), e.g. by the vapour deposition of a conductive material through a mask. This material must be wetting with respect to the material forming the balls 11.

The elements 19' are located on the face 18 of the cover 9 which will be brought towards the substrate 5 having the characterizing member 3 during assembly. The elements 19 of the substrate 5 are produced alongside the characterizing member 3 and on either side of the latter.

The elements 19, 19' will e.g. be of gold or silver and the balls 11 of tin and lead or indium alloy or any other meltable alloy.

The elements of the cover and the substrate are arranged in such a way as to respectively face one another during assembly.

On the substrate 13 equipped with its interconnection elements 19' is deposited an insulating or optionally semi-conductor material coating 47 (part b). As this coating is used for the formation of the boss, its thickness must be carefully checked. Preference is given to a photosensitive or non-photosensitive polyimide coating, whose thickness in the range approximately 10 to 40 μm can easily be checked, particularly using the trammel deposition process.

After producing a mask 49 using photolithography procedures on the coating 47 (part c), etching thereof takes place so as to define the boss 15 and expose the interconnection elements 19' (part d). The etching of the polyimide coating 47 can take place by oxygen plasma or wet chemical etching when the polyimide is not photosensitive.

The mask is also eliminated and on the interconnection elements 19' are formed meltable material balls 11 (part e). These balls 11 are deposited by standard vapour deposition or electrolysis processes.

In another stage (part f), the substrate 5 is joined with the substrate 13. This operation takes place at a temperature slightly above the melting point of the balls, so as to render integral the two substrates.

According to constructional variants, it is possible to join the cover to the substrate of the characterizing member or the substrate of the characterizing member to the cover. In the same way, the interconnection balls can be produced either on the elements of the cover, or on those of the characterizing member substrate.

When the characterizing member is very sensitive, it may be preferable to produce the interconnection balls on the cover.

Finally, as a result of the invention, by combining an e.g. polyimide boss, whose thickness is accurately controlled, and the use of connection balls adapted to the size of the sensor substrate or chip, it is possible to obtain a spacing 4 calibrated to within 1 micrometer between the cover and the characterizing member, and an excellent sensor reliability.

I claim:

1. Integrated electronic sensor for characterizing in a physical quantity, incorporating a substrate (5) having a characterizing member (3), wherein a portion of said characterizing member is able to deform in at least one direction (y,z), and a cover maintained in the vicinity of and in front of the characterizing member (3) by means of at least one meltable material ball (11) integral with the substrate (5) and having a height adapted to the thermomechanical stresses of the sensor, so that a first spacing (H) is provided between the cover (9) and the substrate, characterized in that the cover (9) has a boss (15) with a controlled thickness facing the characterizing member (3), so as to define a second spacing (h) between the cover and the member (3) which is smaller than the spacing between the cover and the substrate.

2. Sensor according to claim 1, characterized in that the boss (15) has an abutment surface (16) for the characterizing member.

3. Sensor according to claim 2, characterized in that the abutment surface (16) is parallel to said direction (y).

4. Sensor according to claim 2, characterized in that the abutment surface (16) is substantially perpendicular to said direction (z).

5. Sensor according to claim 4, characterized in that the boss (15) is made from an electrically conductive material.

6. Sensor according to claim 4, characterized in that the boss (15) has an electrically conductive material part, which forms the abutment surface.

7. Sensor according to claim 1, characterized in that the boss (15) is made from an electrically conductive material.

8. Sensor according to claim 7, characterized in that the boss (15) forms an electrode cooperating with the characterizing member (3).

9. Sensor according to claim 8, characterized in that a three-dimentional accelerometer is produced with the boss (3) serving as the electrode.

10. Sensor according to claim 9, characterized in that the second spacing (h) between the boss (15) and the characterizing member (3) is not in excess of a maximum authorized travel prior to the breaking of the characterizing member (3).

11. Sensor according to claim 1, characterized in that the boss (15) has an electrically conductive material part, which forms an abutment surface.

12. Sensor according to claim 11, characterized in that the boss (15) forms an electrode cooperating with the characterizing member (3).

13. Sensor according to claim 1, characterized in that the second spacing (h) between the boss (15) and the characterizing member (3) is not in excess of a maximum authorized travel prior to the breaking of the characterizing member (3).

14. Sensor according to claim 13, characterized in that the second spacing (h) between the cover and the characterizing member is between 0.5 μm and 5 μm.

15. Sensor according to claim 1, characterized in that the second spacing (h) between the cover and the characterizing member is between 0.5 μm and 5 μm.

16. Sensor according to claim 1, characterized in that the cover (9) has an electronic integrated circuit (21) electrically connected to the characterizing member (3) with the aid of an electrical connection (23, 24, 19, 11, 19').

17. Sensor according to claim 10, characterized in that the electrical connection (23, 24, 19, 11, 19') comprises the ball (11).

18. Sensor according to claim 17, characterized in that both the cover (9) and the substrate (5) has at least one interconnection element (19, 19') respectively connected to the electronic circuit (21) and the characterizing member (3), said elements (19, 19') being interconnected by means of the ball.

19. Sensor according to claim 10, characterized in that both the cover (9) and the substrate (5) has at least one interconnection element (19, 19') respectively connected to the electronic circuit (21) and the characterizing member (3), said elements (19, 19') being interconnected by means of the ball.

20. Process for the production of a sensor according to claim 19, characterized in that it successively comprises the following stages:

producing at least one first interconnection element (19) on the substrate (5) alongside the characterizing member (3) and at least one second element (19') on a face (18) of the cover (9) turned towards the characterizing member (3), the first and second elements (19, 19') being arranged so as to face one another when the substrate (5) and cover (9) are integral, formation locally on the face (18) of the cover (9) of a controlled thickness coating (47) constituting the boss, deposition on one of the facing elements (19, 19') of the meltable material ball, joining and interconnecting the cover (9) and the substrate (5) by melting the meltable material.

21. Process according to claim 20, characterized in that the controlled thickness coating (47) is a polyimide coating.

22. Sensor according to claim 19, characterized in that the characterizing member (3) incorporates a seismic mass (29) formed parallel to a surface of the substrate (5) and in accordance with a plane (x, y) containing said direction (y) and whereof a portion (37) constitutes a plate of a capacitor (41).

23. Sensor according to claim 1, characterized in that the characterizing member (3) incorporates a seismic mass (29) formed parallel to a surface of the substrate (5) and in accordance with a plane (x,y) containing said direction (y) and whereof a portion (37) constitutes a plate of a capacitor (41).

24. Sensor according to claim 23, characterized in that the seismic mass (29) is parallelepipedic and equipped with teeth (33) able to move into grooves (35) made in the substrate (5).

25. Process for the production of a sensor according to claim 24, characterized in that it successively comprises the following stages:

producing at least one first interconnection element (19) on the substrate (5) alongside the characterizing member (3) and at least one second element (19') on a face (18) of the cover (9) turned towards the characterizing member (3), the first and second elements (19, 19') being arranged so as to face one another when the substrate (5) and cover (9) are integral, formation locally on the face (18) of the cover (9) of a controlled thickness coating (47) constituting the boss, deposition on one of the facing elements (19, 19') of the meltable material ball, joining and interconnecting the cover (9) and the substrate (5) by melting the meltable material.

26. Sensor according to claim 1, characterized in that the cover (9) has an electronic integrated circuit (21) electrically connected to the characterizing member (3) with the aid of an electrical connection (23, 24, 19, 11, 19').

* * * * *